United States Patent
Sakamoto et al.

(10) Patent No.: US 7,400,515 B2
(45) Date of Patent: Jul. 15, 2008

(54) CIRCUIT BOARD ELECTRODE CONNECTION STRUCTURE

(75) Inventors: Yasuhiro Sakamoto, Osaka (JP); Tomoyuki Sagara, Nara (JP); Yoshinori Nakajima, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 147 days.

(21) Appl. No.: 11/150,741

(22) Filed: Jun. 10, 2005

(65) Prior Publication Data

US 2005/0286240 A1 Dec. 29, 2005

(30) Foreign Application Priority Data

Jun. 23, 2004 (JP) ............... 2004-185351

(51) Int. Cl.
*H05K 1/14* (2006.01)
(52) U.S. Cl. ............ 361/803; 361/784; 361/792; 361/793; 174/259; 174/261; 174/262
(58) Field of Classification Search ........... 361/803, 361/784, 792, 793, 796, 778, 779; 174/259, 174/261, 262; 439/326, 327
See application file for complete search history.

(56) References Cited

U.S. PATENT DOCUMENTS 4,964,700 A * 10/1990 Takabayashi ............ 349/200
5,019,201 A * 5/1991 Yabu et al. ............... 156/273.9
5,150,231 A * 9/1992 Iwamoto et al. ............ 349/60
5,360,943 A * 11/1994 Mori et al. ............... 174/84 R
5,936,850 A * 8/1999 Takahashi et al. ........... 361/784

FOREIGN PATENT DOCUMENTS

| JP | 06-023996 | 2/1994 |
|---|---|---|
| JP | 10-044418 | 2/1998 |
| JP | 10-100403 | 4/1998 |
| JP | 2000-127404 | 5/2000 |
| JP | 2002-127422 | 5/2002 |

* cited by examiner

*Primary Examiner*—Diego Gutierrez
*Assistant Examiner*—Dameon E Levi
(74) *Attorney, Agent, or Firm*—David G. Conlin; Steven M. Jensen; Edwards Angell Palmer & Dodge LLP

(57) ABSTRACT

An electrode connection structure between outer lead(s) of TCP(s), being first circuit board(s), and actuator member electrode(s) for connection to external circuitry, being second circuit board(s); actuator member(s) electrode(s) for connection to external circuitry being formed in or on floor(s) of recess(es) which is/are step(s) smaller in magnitude than thickness(es) of outer lead(s) protruding from polyimide substrate(s) of TCP(s); adhesive(s) having thickness(es) more or less equal to difference(s) between step(s) and thickness(es) of outer lead(s); and outer lead(s) being electrically and mechanically connected to electrode(s) for connection to external circuitry.

5 Claims, 8 Drawing Sheets

(a)

(b)

under which ink chambers are formed. When electric potentials of opposite phase are applied to mutually opposed electrodes formed on partitions which form ink chambers, an

CIRCUIT BOARD ELECTRODE CONNECTION STRUCTURE

BACKGROUND OF INVENTION

This application claims priority under 35 USC 119(a) to Patent Application No. 2004-185351 filed in Japan on 23 Jun. 2004, the content of which is hereby incorporated herein by reference in its entirety.

The present invention relates to an electrode connection structure for use between/among circuit boards and to an electrode connection structure for use between/among inkjet head(s), semiconductor device(s), liquid crystal display panel(s), MEMS (microelectromechanical system) device(s), and/or the like and circuit board(s) such as flexible wiring board(s).

An electrode connection structure for use between an inkjet head and a flexible wiring board is proposed at Japanese Patent Application Publication Kokai No. 2002-127422 and elsewhere.

Referring to FIG. 9 (a) through (b), a conventional inkjet head will be described in general terms.

An ink chamber comprising a plurality of grooves is formed by lamination of actuator member 100, which is such that piezoelectric material subjected to poling in the thickness direction is laminated together so as to cause polarization directions to be in mutual opposition and which is such that a plurality of grooves are formed in the piezoelectric material; cover member 110, in which ink supply port 111 and common ink chamber 112 are formed; and nozzle plate 120, having nozzle hole 121. Note that the location at which nozzle plate 120 is arranged is taken to be the front end of the ink chamber, and the location opposite to this front end is taken to be the back end of the ink chamber.

The ink chambers are divided by means of partitions, ink chamber electrodes 101 for application of electric field(s) being formed on these partitions.

Formed at the back end of the ink chamber is R-shaped region 102, which is fabricated so as to be R-shaped; and also flat region 103, which serves as electrode lead region for connection with external circuitry. Furthermore, connection electrode 132 of flexible wiring board 130, on which is mounted drive IC (integrated circuit) 131, and electrode 104, which is formed over flat region 103 and which is for connection to inkjet head external circuitry, are electrically and mechanically connected by way of intervening ACF 15 (anisotropic electrically conductive film) 140, in which electrically conductive particles 142 are dispersed throughout epoxy-type resin binder 141.

Here, at the electrode connection region shown at FIG. 9 (b), connection electrode 132 of flexible wiring board 130 protrudes from the board substrate, made up of polyimide, by an amount corresponding to thickness T7 of connection electrode 132; moreover, inkjet head electrode 104 for connection to external circuitry protrudes from the inkjet head substrate, made up of piezoelectric material, by an amount corresponding to thickness T8 of inkjet head electrode 104 for connection to external circuitry. Accordingly, with a conventional electrode connection structure employing ACF 140 or other such adhesive, the thickness of ACF 140 intervening between adjacent electrodes will be approximately (T7+T8); or more accurately, this thickness will be the aforementioned (T7+T8) plus the thickness of the electrically conductive particles in the ACF when in its connected state.

By applying electric potentials of opposite phase to electrodes that face each other by way of intervening partitions at electrodes formed on partitions which form ink chambers, an inkjet head module formed as described above can be driven in shear mode. That is, partitions of ink chambers at lamination boundaries of partitions of ink chambers laminated so as to cause polarization direction to be oriented symmetrically in the thickness direction undergo deformation in v-like fashion; and by utilizing the change in volume within the ink chamber and the change in ink pressure within the ink chamber that occurs in accompaniment thereto, ink droplet(s) can be jetted from small nozzle(s) arranged at the front end of the ink chamber.

Referring to FIGS. 10 through 12, a method by which electrode(s) within ink chamber(s) in a conventional inkjet head are made to extend to the flat region will next be described.

Dry film resist 150 is laminated onto the main surface of the actuator member, photolithography is employed to create resist openings 151 only at portions of flat region 103 (see FIG. 12) at which electrodes are to be formed, and expose and develop operations are carried out. Dicing blade 160 of a dicer is then made to move in the direction indicated by arrow D101 (see FIG. 10) so as to half-dice the piezoelectric material, as a result of which the groove that will later become the ink chamber is formed, and dicing blade 160 is raised to form R-shaped region 102 at the back end of the ink chamber in correspondence to the diameter of the dicing blade. At this time, R-shaped region 102 is made to reach resist opening 151 in dry film resist 150 at flat region 103. After the ink chamber array is formed in this fashion, sputtering and/or plating technique(s) are employed to form metal film(s) comprising Al (aluminum), Cu (copper), Ni (nickel), and/or other such metal electrode material(s) within the ink chambers to form electrodes. Furthermore, in similar fashion, metal film(s) are also formed, forming electrodes, at resist openings 151 in dry film resist 150 at flat region 103 and R-shaped region 102 at the back end of the ink chamber to form inkjet head external circuitry connection electrodes 104 for connection to external circuitry.

Referring to FIG. 9, a conventional method for connecting inkjet head electrode(s) for connection to the exterior and flexible wiring board(s) will next be described.

Following alignment of inkjet head electrode 104 for connection to external circuitry, which is formed over flat region 103 of the aforementioned inkjet head, and connection electrode 132 of flexible wiring board 130, to which ACF 140 has previously been attached in preliminary fashion, a heating tool, not shown, is used to apply heat and pressure to electrically and mechanically connect inkjet head electrode 104 for connection to external circuitry and connection electrode 132 of flexible wiring board 130, completing the ACF connection operation.

Furthermore, in addition to connection between an inkjet head and flexible wiring board as has been described above, patent references (e.g., Japanese Patent Application Publication Kokai No. H06-23996 (1994), Japanese Patent Application Publication Kokai No. H10-44418 (1998), Japanese Patent Application Publication Kokai No. H10-100403 (1998),Japanese Patent Application Publication Kokai No. 2000-127404, and Japanese Patent Application Publication Kokai No. 2002-127422) have proposed connection between flexible wiring board and rigid printed wiring board, and connection between semiconductor device and flexible wiring board, but just as was the case for conventional connection structures between inkjet heads and flexible wiring boards, these are such that the thickness of ACF or other such adhesive at the electrode connection region is the same as, or is the same as or more than, the thickness of the electrode protruding from the board substrate.

A variety of problems such as the following can arise when a conventional circuit board connection structure as has been described above is employed to connect device(s) to circuit board(s) or is employed to connect circuit board(s) to circuit board(s).

With a conventional electrode connection structure between inkjet head(s) and flexible wiring board(s) employing adhesive(s), the thickness of the ACF or other such adhesive between the boards may be greater than or equal to the thickness of the two electrodes being connected. Adhesive typically having a high coefficient of linear expansion (60 ppm/° C. to 150 ppm/° C.), because a rise in temperature at the electrode connection region will cause adhesive at the electrode connection region to expand by a large amount, with thermal stresses acting in a direction such as will tend to spread the electrodes apart, there has been the problem of occurrence of electrical continuity failures. Furthermore, there has been the problem that the high magnitude of the strain experienced by adhesive with change in temperature causes adhesive force to deteriorate, and there has been the problem of early failure during thermal cycling reliability testing.

Furthermore, just as was the case for the inkjet head electrode connection structure described above, conventional electrode connection structures between circuit boards, e.g., such as those between flexible wiring board(s) and rigid wiring board(s), have the problems of electrical continuity failures at elevated temperature and early deterioration in reliability with thermal cycling.

The present invention was conceived in light of such state of affairs, it being an object thereof to provide a circuit board electrode connection structure having high reliability as a result of prevention of early deterioration in reliability with thermal cycling due to reduction in magnitude of strain due to thermal stress and/or prevention of occurrence of electrical continuity failures.

SUMMARY OF INVENTION

In order to solve the foregoing and/or other problems, a circuit board electrode connection structure in accordance with one or more embodiments of the present invention comprises a plurality of circuit boards; one or more electrodes formed in or at least one of the circuit boards; and one or more electrode connection regions present at at least one of the circuit boards; wherein at least a portion of the circuit boards are connected by way of one or more adhesives intervening therebetween or thereamong; and wherein at least one thickness of at least one of the adhesive or adhesives between or among at least two of the plurality of circuit boards at at least one of the electrode connection region or regions is less than at least one thickness of at least one of the electrode or electrodes.

In accordance with embodiment(s) of the present invention having such feature(s), adhesive(s) containing epoxy-type resin(s) (for which coefficient of linear expansion is 60 ppm/° C. to 150 ppm/° C.) and/or the like, which typically have coefficient(s) of linear expansion greater than that or those of board substrate(s) of the circuit board(s) (coefficient of linear expansion for glass epoxy is 10 ppm/° C. to 50 ppm/° C.; coefficient of linear expansion for polyimide is 12 ppm/° C. to 20 ppm/° C.), Cu or other such electrode metal material(s) (for which coefficient of linear expansion is 10 ppm/° C. to 20 ppm/° C.), or device substrate(s) (coefficient of linear expansion for piezoelectric material (PZT) is 2 ppm/° C. to 6 ppm/° C.; coefficient of linear expansion for semiconductor material is 3 ppm/° C. to 5 ppm/° C.) may be thinner than would be the case in a conventional electrode connection structure, even where the adhesive(s) is/are present in intervening fashion at the electrode connection region(s) so as to electrically and mechanically connect a plurality of the circuit boards. This being the case, thermal stresses during temperature rises acting in direction(s) tending to cause mutual separation of the electrodes, e.g., between the device substrate and the circuit board or between two of the circuit boards which are connected together, can be reduced, permitting prevention of occurrence of electrical continuity failures, since the relative contribution due to that or those material(s) other than the adhesive(s) which, among the various material(s) employed in forming the constituent members of the electrode connection region(s), has or have the largest coefficient(s) of linear expansion increases. Furthermore, because the magnitude of strain resulting from thermal stresses can be reduced, it is possible to prevent early deterioration in reliability with thermal cycling, making it possible to achieve a circuit board electrode connection structure having high reliability.

Furthermore, a circuit board electrode connection structure in accordance with one or more embodiments of the present invention may be such that at least one of the circuit boards comprises one or more first circuit boards, and one or more second circuit boards; at least one of the first circuit board or boards comprises one or more first board substrates; at least one of the second circuit board or boards comprises one or more second board substrates; at least one of the electrode or electrodes protrudes from at least one of the first board substrate or substrates of at least one of the first circuit board or boards; at least one recess is formed in at least one of the second circuit board or boards; at least one of the electrode or electrodes is formed in or on at least one floor of at least one of the recess or recesses of at least one of the second circuit board or boards; at least one step (e.g., T2 in the embodiment presented below and thereafter) is formed in at least one depth dimension from at least one surface of at least one of the electrode or electrodes of at least one of the second circuit board or boards to at least one surface of at least one of the second board substrate or substrates of at least one of the second circuit board or boards; at least one magnitude of at least one of the step or steps is smaller than at least one thickness (e.g., T1 in the embodiment presented below and thereafter) of at least one of the electrode or electrodes protruding from at least one of the first board substrate or substrates of at least one of the first circuit board or boards; and electrical and mechanical connection is carried out with at least one thickness of at least one of the adhesive or adhesives being substantially equal to at least one difference (e.g., T1−T2 in the embodiment presented below and thereafter) between at least one of the thickness or thicknesses (T1) of at least one of the electrode or electrodes protruding from at least one of the first board substrate or substrates of at least one of the first circuit board or boards and at least one of the magnitude or magnitudes (T2) of at least one of the step or steps in at least one of the recess or recesses in at least one of the second circuit board or boards.

Where a surface of the electrode of at least one of two of the circuit boards which are connected together, for example, is arranged at a location lower by the amount of a step (e.g., step T2 in the embodiment presented below) from the board substrate of that circuit board, such feature(s) in accordance with embodiment(s) of the present invention being applied to an electrode connection structure between the circuit board and the circuit board having the electrode thickness (T1), the thickness of the adhesive may be the difference (T1−T2) between electrode thickness (T1) and step (T2). In contrast, e.g., at the conventional electrode connection structure shown in FIG. 9, the thickness of the adhesive will necessarily be (T7+T8) when electrodes of thickness T7 and thickness T8 are connected together. That is, because thickness (T1−T2) of the adhesive in circuit board electrode connection structure(s) in accordance with embodiment(s) of the invention under application may be less than thickness (T7+T8) of adhesive in conventional circuit board electrode connection structures, thermal stresses during temperature rises acting in direction (s) tending to cause mutual separation of the electrodes between the device substrate and the circuit board or between two of the circuit boards which are connected together can be reduced, just as was the case above, permitting prevention of occurrence of electrical continuity failures, since the relative contribution due to that or those material(s) other than the adhesive(s) which, among the various material(s) employed in forming the constituent members of the electrode connection region(s), has or have the largest coefficient(s) of linear expansion increases. Furthermore, because the magnitude of strain resulting from thermal stresses can be reduced, it is possible to prevent early deterioration in reliability with thermal cycling, making it possible to achieve a circuit board electrode connection structure having high reliability.

Furthermore, a circuit board electrode connection structure in accordance with embodiment(s) of the present invention may be such that at least one thickness (T1−T2) of at least one of the adhesive or adhesives is substantially not more than 10μ.

Now, in a conventional circuit board electrode connection structure, electrode thickness is ordinarily 18μ (½ oz. copper foil) to 36μ (1 oz. copper foil), and the thickness of adhesive intervening between adjacent electrodes following connection of the circuit boards to each other is 36μ to 72μ or more. This being the case, because thickness (T1−T2) of the adhesive in circuit board electrode connection structure(s) may, in accordance with embodiment(s) of the invention under application, be substantially not more than 10μ, thermal stresses during temperature rises can easily be reduced to ⅓ to ⅟₇ of conventional thermal stresses; and just as was the case above, thermal stresses during temperature rises acting in direction(s) tending to cause mutual separation of the electrodes between the device substrate and the circuit board or between two of the circuit boards which are connected together can be reduced, permitting prevention of occurrence of electrical continuity failures, since the relative contribution due to that or those material(s) other than the adhesive(s) which, among the various material(s) employed in forming the constituent members of the electrode connection region(s), has or have the largest coefficient(s) of linear expansion increases. Furthermore, because the magnitude of strain resulting from thermal stresses can be reduced, it is possible to prevent early deterioration in reliability with thermal cycling, making it possible to achieve a circuit board electrode connection structure capable of ensuring reliability over a period which is at least several times longer than would be the case with an electrode connection region having a conventional structure.

Furthermore, a circuit board electrode connection structure in accordance with embodiment(s) of the present invention may be such that at least one thickness of at least one of the adhesive or adhesives at at least one of the electrode connection region or regions is less than at least one thickness of at least one of the electrode or electrodes of at least one of the circuit boards; and such that at least one of the objects being bonded (the circuit boards) is an inkjet head, semiconductor device, liquid crystal display panel, MEMS, and/or other such device.

In accordance with embodiment(s) of the present invention having such feature(s), where inkjet device(s) and/or other such device(s) is/are made into module(s), thermal stresses during temperature rises acting in direction(s) tending to cause mutual separation of electrodes of device module(s) and the circuit board(s) connected thereto can be reduced, just as was the case above, permitting prevention of occurrence of electrical continuity failures, since the relative contribution due to that or those material(s) other than the adhesive(s) which, among the various material(s) employed in forming the constituent members of the electrode connection region (s), has or have the largest coefficient(s) of linear expansion increases. Furthermore, because the magnitude of strain resulting from thermal stresses can be reduced, it is possible to prevent early deterioration in reliability with thermal cycling, making it possible to achieve a circuit board electrode connection structure having high reliability.

Furthermore, a circuit board electrode connection structure in accordance with embodiment(s) of the present invention may be such that at least one thickness of at least one of the adhesive or adhesives at at least one of the electrode connection region or regions is less than at least one thickness of at least one of the electrode or electrodes of at least one of the circuit boards; and such that at least one of the adhesive or adhesives is one or more anisotropic electrically conductive adhesives.

In accordance with embodiment(s) of the present invention having such feature(s), because at least one of the adhesive or adhesives may be one or more anisotropic electrically conductive adhesives, for example, thermal stresses during temperature rises acting in direction(s) tending to cause mutual separation of the electrodes of the device module(s) and the circuit board(s) connected thereto can be reduced, permitting prevention of occurrence of electrical continuity failures, since the relative contribution due to that or those material(s) other than the adhesive(s) which, among the various material (s) employed in forming the constituent members of the electrode connection region(s), has or have the largest coefficient (s) of linear expansion increases. Furthermore, because the magnitude of strain resulting from thermal stresses can be reduced, it is possible to prevent early deterioration in reliability with thermal cycling, making it possible to achieve a circuit board electrode connection structure having high reliability.

Furthermore, because direct contact cannot occur unless the step (T2) at the recess in one of the circuit boards that are connected is formed so as to be smaller in magnitude than the thickness (T1) of the electrode of the other of the circuit boards, to carry out the electrode connection structure under application using electrically insulating adhesive it will be necessary to form the step such that 0<T2<T1. However, where ACF or other such anisotropic electrically conductive adhesive(s) is/are used, because electrically conductive plastic particles which undergo elastic deformation during operations to connect circuit boards on which electrically conductive films are formed over plastic cores and/or electrically conductive metal particles which undergo plastic deformation during operations connecting circuit boards intervene between electrodes being connected (such particles could, for example, be made to serve as electrically conductive particles, the diameter of which might be taken to be T4), even if the step (T2) were to be formed so as to be larger in magnitude than thickness (T1) of the electrode (i.e., such that T1≦T2), so long as the step (T2) is within one diameter of the electrically conductive particles that intervene between the electrodes being connected (i.e., such that T2<(T1+T4)) it will be possible to carry out the electrode connection structure under application. Here, upon consideration of the amount of squeeze which is experienced by the electrically conductive particles when the electrodes are brought into mutual contact by way of the electrically conductive particles (e.g., taking the amount of squeeze to be T4', 0<T4'<T4), the condition for formation of the step (T2) becomes (T4−T4')<T2<(T1+T4); and so because the electrode connection structure of the present application can be carried out over a wider range, process latitude during the step formation process can be increased, permitting improvement in manufacturability of the device(s) and/or the circuit board(s) on which the step(s) (T2) is/are formed.

As described above, a circuit board electrode connection structure in accordance with embodiment(s) of the present invention may be such that the adhesive(s) is/are thinner than would be the case in a conventional electrode connection structure, even where the adhesive(s), which contain epoxy-type resin(s) and/or other such substance(s) typically having coefficient(s) of linear expansion greater than that or those of the constituent members of the electrode connection region (s)—i.e., board substrate(s) of the circuit board(s), the electrode metal material(s), and/or the device substrate(s)—is/are present in intervening fashion at the electrode connection region(s) so as to electrically and mechanically connect the circuit boards. This being the case, thermal stresses during temperature rises acting in direction(s) tending to cause mutual separation of the electrodes, e.g., between the device substrate and the circuit board or between two of the circuit boards which are connected together, can be reduced, as a result of which it is possible to prevent occurrence of electrical continuity failures, since the relative contribution due to that or those material(s) other than the adhesive(s) which, among the constituent members of the electrode connection region(s), has or have the largest coefficient(s) of linear expansion increases. Furthermore, because the magnitude of strain resulting from thermal stresses can be reduced, it is possible to prevent early deterioration in reliability with thermal cycling, making it possible to achieve a circuit board electrode connection structure having high reliability.

Note, moreover, that whereas reference numerals from the embodiments presented below have been employed by way of example in describing various requisite thicknesses in circuit board electrode connection structures associated with embodiments of the present invention as described above, the present invention is not limited to the embodiments presented below, the scope of the present invention being as indicated by the scope of the claims.

DESCRIPTION OF PREFERRED EMBODIMENTS

Below, embodiments of the present invention are described with reference to the drawings.

Embodiment 1

Below, a first embodiment of the present invention is described with reference to the drawings.

Figure 1:
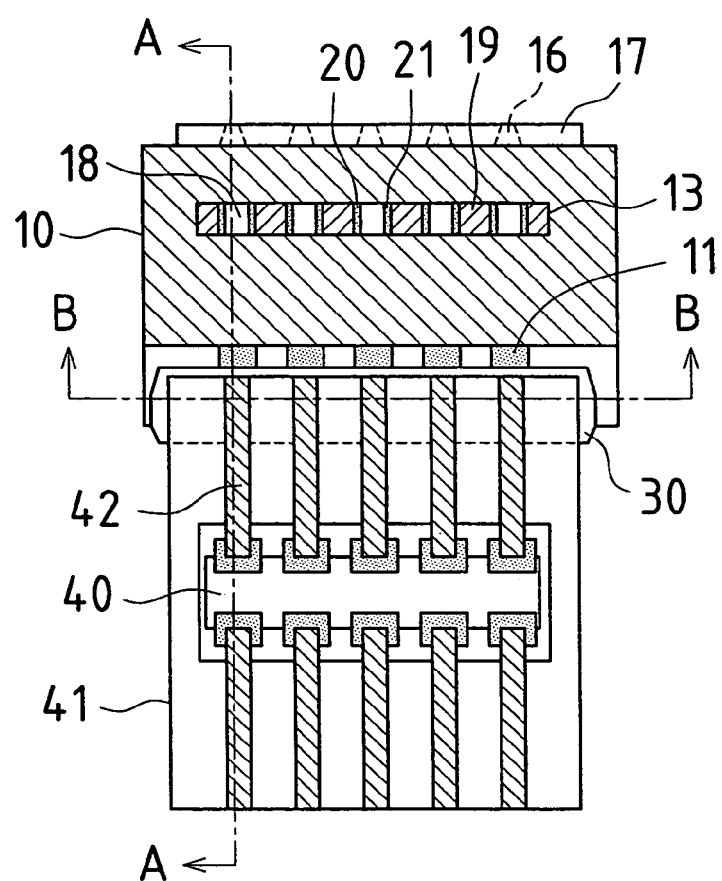
FIG. 1 is a sectional view showing a circuit board electrode connection structure associated with a first embodiment of the present invention as viewed from above.
Figure 2:
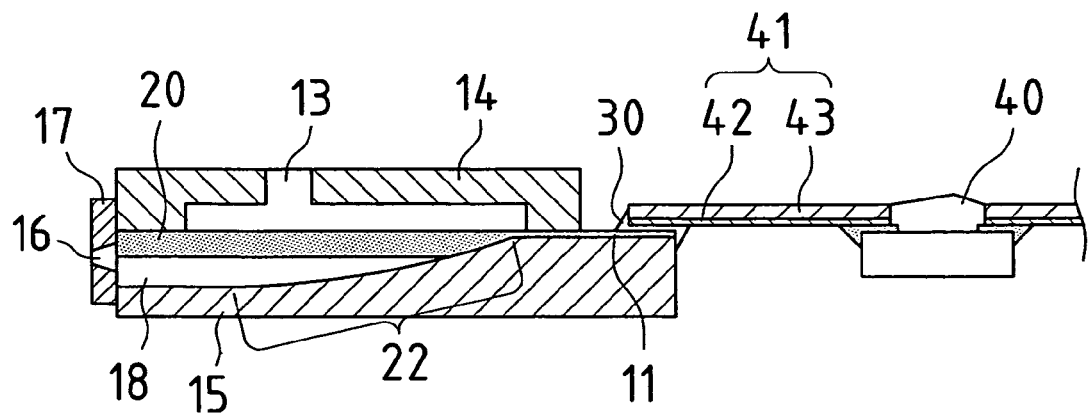
FIG. 2 is a cross-sectional view of section A-A shown in FIG. 1.

FIG. 1 is a sectional view showing a circuit board electrode connection structure associated with the first embodiment of the present invention as seen in plan view; FIG. 2 is a cross-sectional view of section A-A in FIG. 1; and FIG. 3 is a cross-sectional view of section B-B in FIG. 1.

In the present first embodiment, an inkjet head employing anisotropic electrically conductive adhesive is used as example of an object being bonded; and a flexible wiring board (here, a TCP; i.e., tape carrier package) is used as an example of a circuit board.

Figure 3:
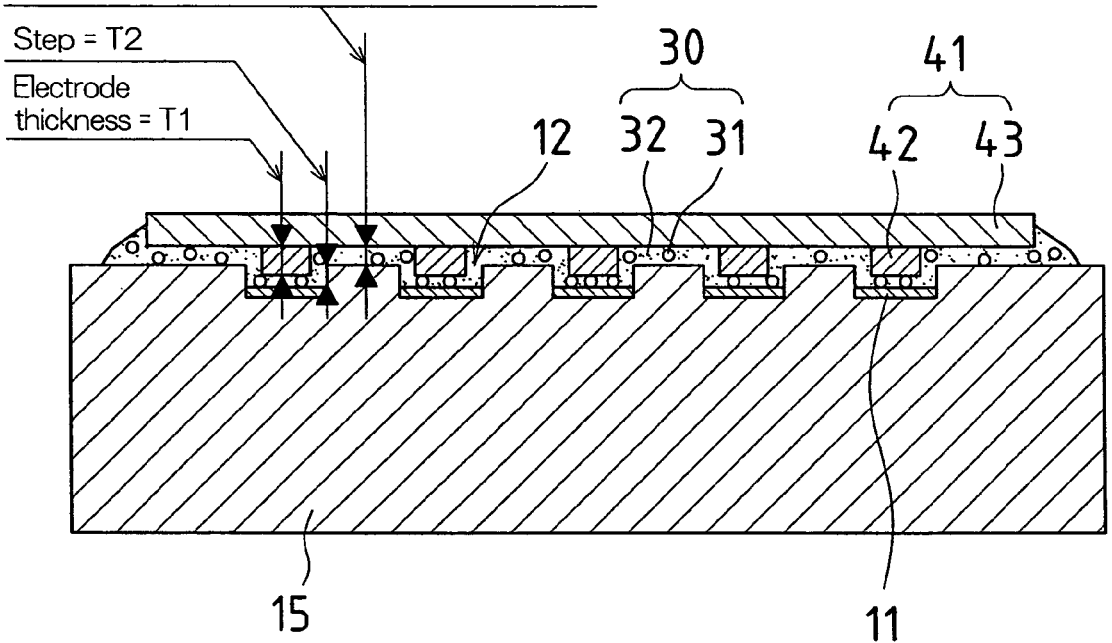
FIG. 3 is a cross-sectional view of section B-B shown in FIG. 1.

As shown in FIGS. 1 through 3, electrode connection structure(s) at inkjet head(s) 10 is/are such that outer lead(s) 42 is/are formed on TCP(s) 41 on which inkjet head drive IC(s) 40 is/are mounted; the structure being such that electrical and mechanical connection to external circuitry connection electrode(s) 11 of inkjet head(s) 10 is achieved by means of ACF(s) (anisotropic electrically conductive film(s)) 30 serving as anisotropic electrically conductive adhesive(s) (what is referred to as adhesive(s) in the context of the present invention) comprising electrically conductive Ni particles 31 and epoxy resin binder(s) 32. Furthermore, above inkjet head 10, cover member(s) 14, in which ink supply port(s) 13 has/have previously been formed, have been made to adhere to actuator member(s), on which groove(s) has/have been formed. Moreover, nozzle plate(s) 17, having small nozzle(s) 16, have been made to adhere to surface(s) of inkjet head 10 from which ink is jetted.

With such a construction, ink chambers 18, which are arranged in array-like fashion, are divided by means of partitions 19 of ink chambers 18 comprising piezoelectric material(s). At these ink chambers 18, voltages of identical electric potential are applied to two Cu electrodes 20, 21 of thickness 1µ which are arranged at the upper half of each partition 19, application of voltages of opposite phase to electrodes 20 and 21 which are in mutual opposition, being on the front and back sides of partitions 19 of ink chambers 18, causes partitions 19 of ink chambers 18 to function as actuators driven in shear mode, control of ink pressure within ink chambers 18 permitting small ink droplets to be jetted from nozzles 16. At this time, the two Cu electrodes 20, 21 are combined into a single electrode at R-shaped region 22 at the back end of ink chamber 18 to constitute electrode 11 for connection to external circuitry, this being formed at recess 12 having step T2 (see below).

FIG. 3 is a view of a cross-section along the direction in which electrodes are lined up at electrode connection regions. Outer lead 42 of TCP 41 is constructed such that Ni and Au (gold) plating is applied over 1 oz. copper foil wiring (thickness 36μ). The total thickness (Ti) of outer lead 42 as measured from polyimide substrate 43 of TCP 41 is 40μ. External circuitry connection electrode 11 of inkjet head 10 is formed so as to be approximately 2μ in thickness at the floor of recess 12, which is lower than the surface of the substrate of the piezoelectric material of inkjet head 10 by 37μ; and the depth (dimension in the depth direction) from the surface of external circuitry connection electrode 11 to the piezoelectric material substrate surface is taken to be step T2, where the magnitude of this step T2 at recess 12 is 35μ.

Furthermore, a bonding tool, not shown, is used to apply heat and pressure to electrically conductive Ni particles 31 of diameter 6μ within ACF 30 from the back side (substrate side) of TCP 41 so as to cause the gap between opposing connection electrodes (between external circuitry connection electrode 11 of inkjet head 10 and outer lead 42 of TCP 41) to be 5μ. As a result of this application of heat and pressure, electrically conductive Ni particles 31 of ACF 30 are made to intervene between external circuitry connection electrode 11 and outer lead 42, electrically connecting external circuitry connection electrode 11 and outer lead 42. Moreover, epoxy resin binder 32 of ACF 30 is thermally cured, mechanically connecting external circuitry connection electrode 11 and outer lead 42. At this time, electrically conductive Ni particles 31 undergo plastic deformation under pressure, and the thickness (T1–T2+the thickness of compressed electrically conductive particles 31) of anisotropic electrically conductive adhesive (ACF 30) between adjacent electrodes (between external circuitry connection electrode 11 of inkjet head 10 and outer lead 42 of TCP 41) is made to be 10μ.

Due to provision of such structure, the circuit board electrode connection structure in the present first embodiment is such that the thickness of anisotropic electrically conductive adhesive (ACF 30) between inkjet head 10 and TCP outer lead 42, which are connected, is made to be 10μ. As a result, prevention of occurrence of electrical continuity failures is permitted, as thermal stresses during temperature rises acting in direction(s) tending to cause mutual separation of electrodes can be reduced to approximately ¼ of what they would be with a conventional electrode connection structure in which adhesion is accomplished by means of adhesive which is 42μ, this being the sum of a 40μ thickness at outer lead 42 and a 2μ thickness at external circuitry connection electrode 11 of inkjet head 10. Furthermore, because the magnitude of strain resulting from thermal stresses can also be reduced to approximately ¼ of what it would otherwise be, it is possible to prevent early deterioration in reliability with thermal cycling, making it possible to achieve a circuit board electrode connection structure having high reliability. At this time, because the coefficient of thermal expansion of the piezoelectric material present instead of the adhesive provided between electrodes in conventional circuit board electrode connection structures is, at 2 ppm/° C., extremely low compared with the coefficient of thermal expansion of approximately 100 ppm/° C. which holds for anisotropic electrically conductive adhesives such as ACF 30 and the like, the relative magnitude of this makes it possible to dismiss same from consideration as a thermal-stress-generating member.

Furthermore, in the present first embodiment, because connection of electrodes is carried out by means of anisotropic electrically conductive adhesive (ACF 30) containing electrically conductive Ni particles 31 of diameter 6μ, it is possible to achieve widened process latitude at the operation for forming recess 12 as compared with the case where electrically insulating adhesive not containing electrically conductive particles is used to bring the electrodes into mutual contact to achieve electrical connection. Where electrically insulating adhesive is employed, it will be necessary to form the step such that 0<step T2 at recess 12<thickness T1 of electrode 42 of TCP 41. For the present embodiment this would mean that 0<step T2 at recess 12<40μ, but where ACF 30 or other such anisotropic electrically conductive adhesive is used it would be the case that {diameter (6μ) of electrically conductive Ni particles 31–squeeze (2μ to 5μ) of electrically conductive Ni particles 31}<step T2 at recess 12<{thickness T1 of electrode 42 of TCP 41+diameter of electrically conductive Ni particles 31 }, which is to say, taking the widest possible range, that 1μ<step at recess<46μ; and so, because it is possible to achieve widened process latitude at the operation for step formation, improvement in manufacturability is permitted.

Next, a method for forming an electrode structure for which there is a step at recess 12 of inkjet head 10 will be described with reference to the drawings.

Figure 4:
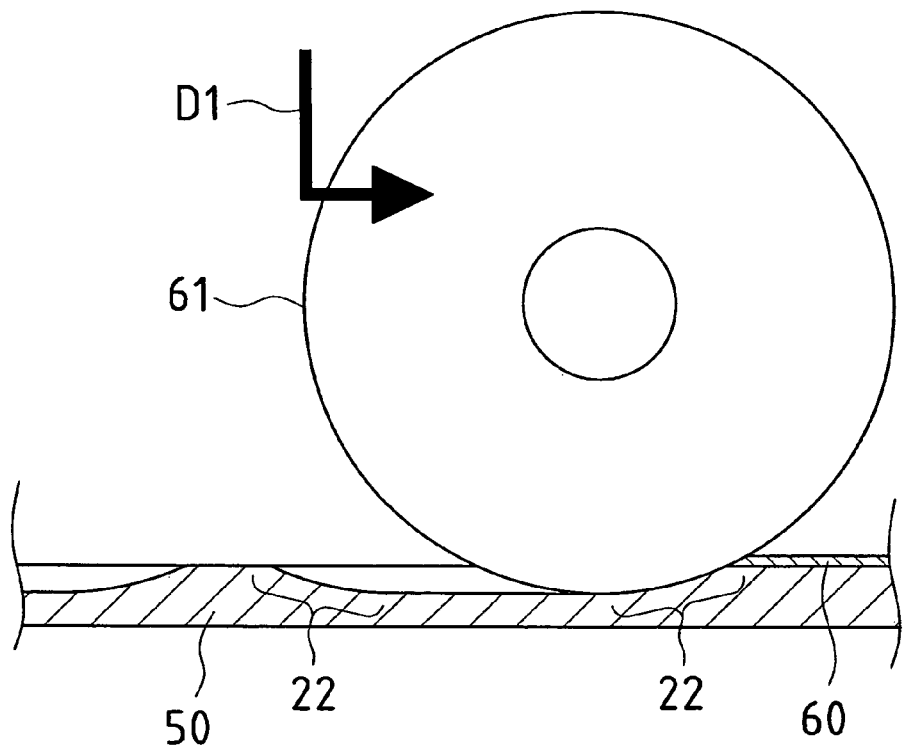
FIG. 4 is a sectional view to assist in describing operations illustrative of an example of a method for forming the circuit board electrode connection structure shown in FIG. 1.
Figure 5:
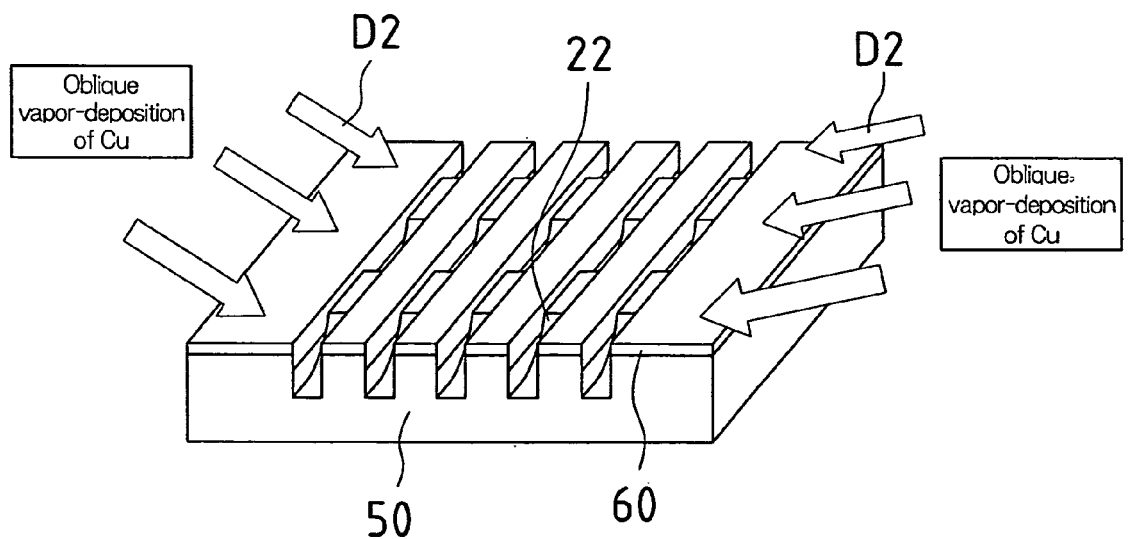
FIG. 5 is an oblique view to assist in describing operations illustrative of an example of a method for forming the circuit board electrode connection structure shown in FIG. 1.
Figure 6:
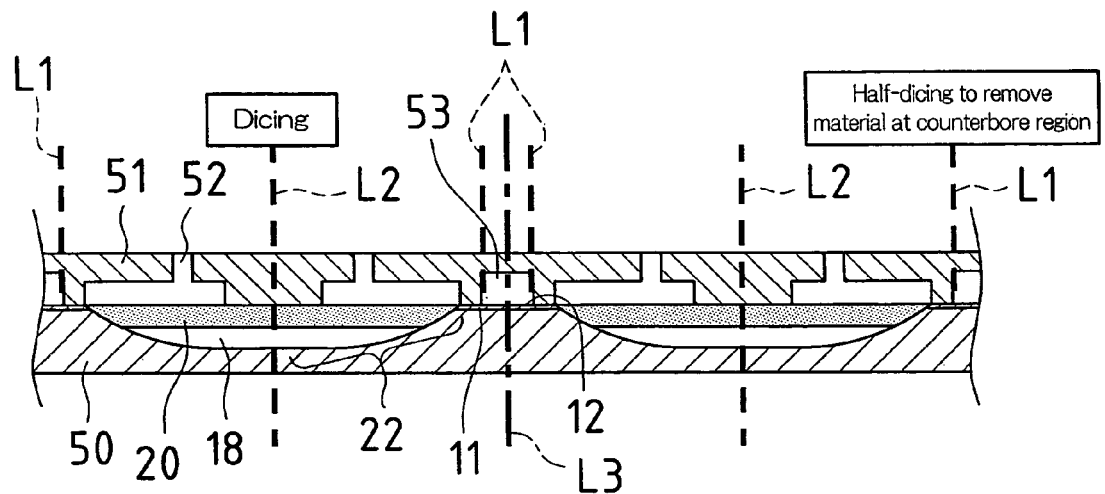
FIG. 6 is a sectional view to assist in describing operations illustrative of an example of a method for forming the circuit board electrode connection structure shown in FIG. 1.

FIGS. 4 through 6 are drawings to assist in describing operations illustrative of an example of a method for forming the circuit board electrode connection structure shown in FIGS. 1 through 3.

First, dry film resist 60 is laminated and cured over one surface of piezoelectric material wafer 50 which has been subjected to poling in the thickness direction.

Next, as indicated by arrow D1 in FIG. 4, dicing blade 61 of a dicer is used to half-dice piezoelectric material wafer 50 to a depth of 300μ, as a result of which ink chamber 18 (see FIG. 6) is formed, and dicing blade 61 is raised to form R-shaped groove 22 at the back end of the ink chamber in correspondence to the diameter of the dicing blade, following which a shallow groove (recess 12; see FIG. 6) is formed in piezoelectric material 50 to a depth of 35μ. After an array of ink chambers 18 is formed in this fashion, Al, Cu, and/or other such metal(s) that will serve as electrode material(s) are deposited by oblique vapor deposition diagonally from above, and perpendicularly with respect to the long direction of ink chamber 18, as indicated by arrow D2 in FIG. 5. By carrying out this procedure from two directions, i.e., from the left and the right of the long direction of ink chamber 18, Cu electrodes 20 are formed on the surfaces of partitions 19 (see FIG. 1) of ink chambers 18, shadowing by dry film resist 60 and partitions 19 of respective ink chambers 18 causes metal film formation to be carried out to a location which is about halfway down in the depth direction of ink chambers 18. Furthermore, metal film (external circuitry connection electrode 11; see FIGS. 1 through 3) is formed over more or less the entire surface within the shallow groove region (recess 12) of depth 35μ. By thereafter causing dry film resist 60 to be lifted off, there being no electrode formed over partitions 19 of ink chambers 18, it is possible to achieve definitive electrical separation between respective ink chambers 18.

Next, cover wafer 51, which comprises piezoelectric material and which has formed therein counterbore region 53 to provide clearance for external circuitry connection electrode 11 and stepped through-hole 52 for ink supply port 13 (see FIGS. 1 through 2), is prepared. This cover wafer 51 forms ink supply port 13 when made into an inkjet head, and serves as cover member 14 which closes off the region above ink chambers 18. So that the coefficient of thermal expansion is well-matched relative to the actuator which forms ink chamber 18, cover wafer 51 is ordinarily formed from the same piezoelectric material as is used to form ink chamber 18; but it is also possible to use alumina ceramic, which is inexpensive and which has a coefficient of thermal expansion that is relatively close thereto. A commercially available adhesive is used to attach cover wafer 51 to piezoelectric material wafer 50, in which the array of ink chambers 18 has been formed. At this time, alignment is carried out so as to cause the portion corresponding to external circuitry connection electrode 11 to line up with the center of counterbore region 53 of cover wafer 51, and the two are laminated together as in the sectional view of FIG. 6.

The dicing blade of a dicer, not shown, is then used to carry out dicing along the dicing lines indicated by dashed lines L1 at FIG. 6 so as to remove cover wafer 51 above the portion corresponding to external circuitry connection electrode 11 of piezoelectric material wafer 50. This is then subdivided into individual inkjet heads along the center L2 of lamination of ink chamber 18 at piezoelectric material wafer 50 and the center L3 of external circuitry connection electrode 11, completing formation of the inkjet heads.

Note that the present invention is not limited to cantilever-type inkjet devices employing piezoelectric material wafers having unidirectional poling characteristics as was the case at the foregoing first embodiment, it being possible to apply the invention to chevron-type inkjet heads employing piezoelectric material in which piezoelectric material subjected to poling in the thickness direction is laminated together such that polarization directions are in mutual opposition. Furthermore, the present invention is not limited to such an inkjet head device, it being possible to obtain similar effect when the invention is applied to semiconductor device(s), liquid crystal display panel(s), and/or MEMS device(s).

Embodiment 2

Next, a second embodiment of the circuit board electrode connection structure of the present invention is described with reference to the drawings.

Figure 7:
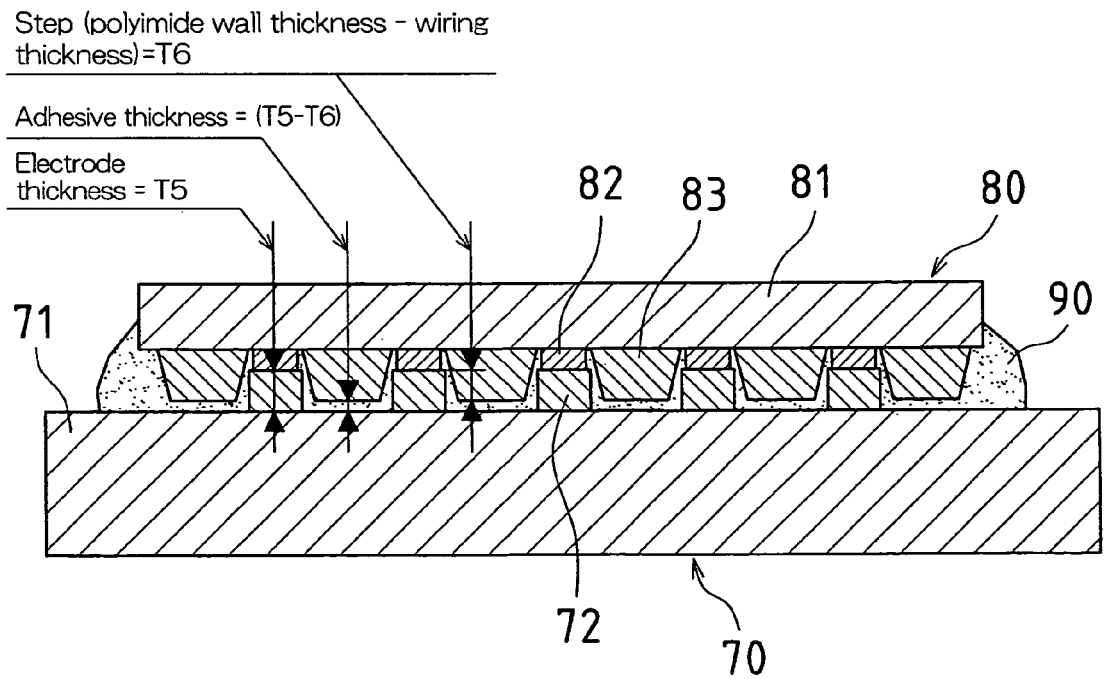
FIG. 7 is a sectional view showing a circuit board electrode connection structure associated with a second embodiment of the present invention.

FIG. 7 is a sectional view showing a circuit board electrode connection structure associated with the second embodiment of the present invention.

At the present second embodiment, a circuit board electrode connection structure in which adhesive is used to connect two circuit boards is described. A glass epoxy wiring board is used as one of the circuit boards, and a flexible wiring board is used as the other of the circuit boards.

Glass epoxy wiring board 70 is made up of glass epoxy substrate 71 and electrode(s) 72. Electrode 72 is such that Ni and Au plating is applied over ½ oz. copper foil wiring (thickness 18μ) formed over glass epoxy board substrate 71, this protruding from glass epoxy substrate 71 to a thickness (T5) of approximately 20μ.

On the other hand, flexible wiring board 80 is made up of polyimide substrate 81; a plurality of runs of Cu wiring 82 which are formed over polyimide substrate 81 and which is 6μ in thickness; and polyimide wall(s) 83 which is/are formed to a height of 16μ between adjacent runs of this Cu wiring 82. At this flexible wiring board 80, the surface of Cu wiring 82 is formed so as to be present at a location which is lower by the amount of a 10μ step (T6) from the surface of polyimide wall 83.

Furthermore, electrically insulating adhesive 90 (what is referred to as adhesive(s) in the context of the present invention) fills the spaces between adjacent runs of the aforementioned wiring, glass epoxy wiring board 70 and flexible wiring board 80 being made to oppose one another such that the thickness of electrically insulating adhesive 90 between glass epoxy board substrate 71 and polyimide wall 83 is 10μ (T5–T6) so as to cause electrode 72 and Cu wiring 82 to be brought into direct mutual contact in such fashion that they are electrically connected. With the assembly in this state, electrically insulating adhesive 90, which has been made to intervene between glass epoxy wiring board 70 and flexible wiring board 80, is cured to achieve mechanical connection between glass epoxy wiring board 70 and flexible wiring board 80.

Due to provision of such structure, the circuit board electrode connection structure in the present second embodiment is such that the sum of the 20μ thickness of electrode 72 of glass epoxy wiring board 70 and the 6μ thickness of Cu wiring 82 of flexible wiring board 80, which are connected, is 26μ. Thermal stresses during temperature rises acting in direction(s) tending to cause mutual separation of electrodes are such that expansion per C.° of the member, expressible as the product of coefficient of thermal expansion and thickness from the fact that the coefficient of linear expansion of polyimide is approximately 15 ppm/° C. and polyimide wall 83 is present to a thickness of 16μ, and from the fact that adhesive at approximately 100 ppm/° C. is present to a thickness of 10μ, for a total thickness of 26μ at 100 ppm/° C., can be reduced to approximately ½ of what it would be with a conventional electrode connection structure in which adhesion is accomplished by means of electrically insulating adhesive. As a result, it is possible to prevent occurrence of electrical continuity failures. Furthermore, because the magnitude of strain resulting from thermal stresses can also be reduced to approximately ½ of what it would otherwise be, it is possible to prevent early deterioration in reliability with thermal cycling, as indicated at TABLE 1, making it possible to achieve a circuit board connection structure having high reliability.

TABLE 1

Thermal Cycling (−40° C./100° C.) Test Results

| Adhesive thickness | 500 cyc | 1000 cyc | 1500 cyc | 2000 cyc | 3000 cyc |
|---|---|---|---|---|---|
| 10 μm | OK | OK | OK | OK | OK |
| 20 μm | OK | OK | NG | — | — |
| 40 μm | OK | NG | — | — | — |

At TABLE 1, note that thicknesses of electrically insulating adhesive 90 are listed vertically, these being 10μ, 20μ, and 40μ. Furthermore, number of thermal cycles is listed horizontally, one cycle here being taken to be the situation existing when temperature at the periphery of the circuit board is varied from −40° C. to 100° C. and is then varied from 100° C. to −40° C. Moreover, the condition existing when no abnormality occurred at the electrode connection region is listed as "OK," and the condition existing when an abnormality did occur is listed as "NG."

Next, a method for manufacturing the aforementioned flexible wiring board 80 is described with reference to the drawings.

Figure 8:
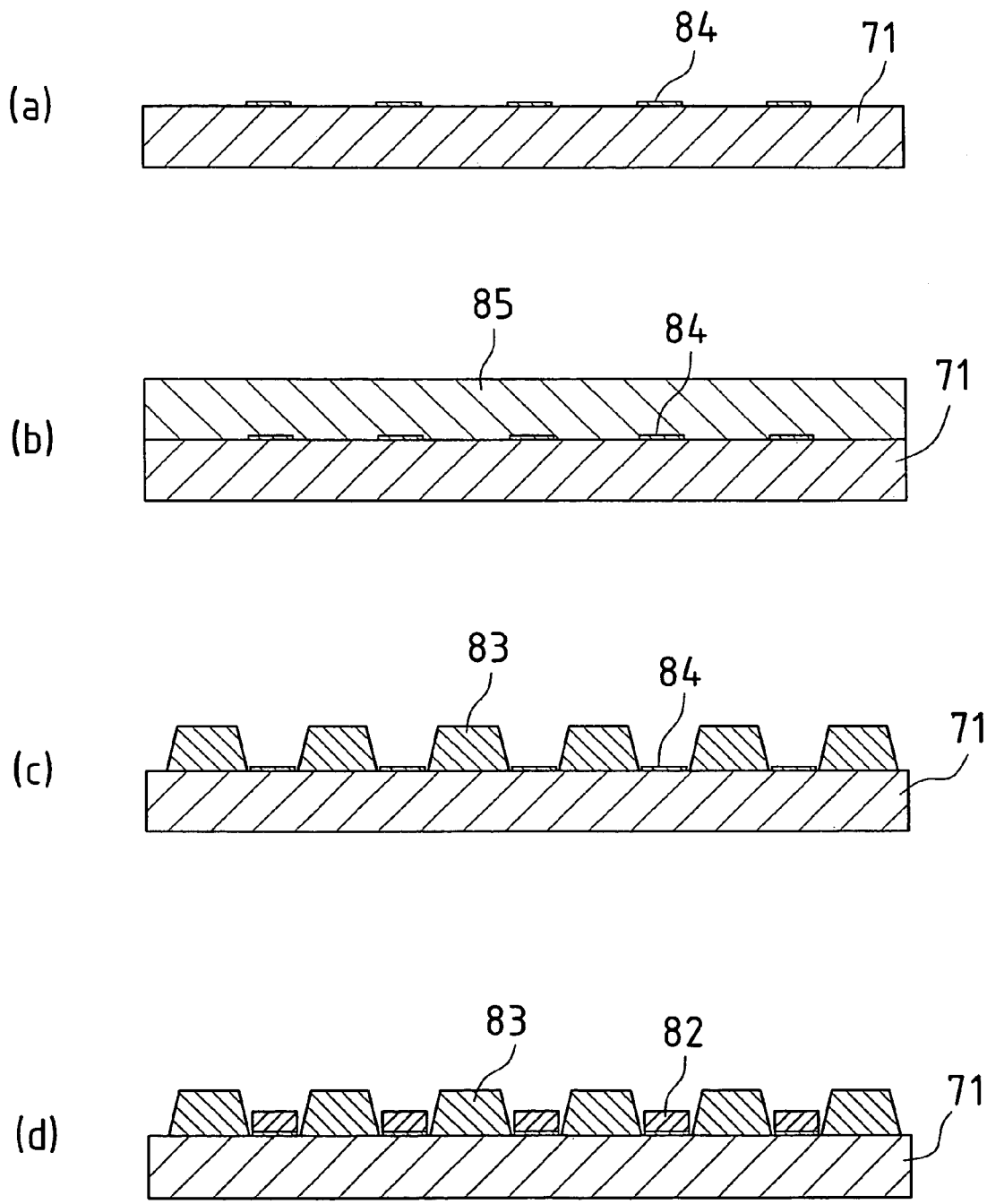
FIG. 8 is a sectional view to assist in describing operations illustrative of an example of a method for manufacturing a flexible wiring board constituting the circuit board electrode connection structure shown in FIG. 7.
Figure 9:
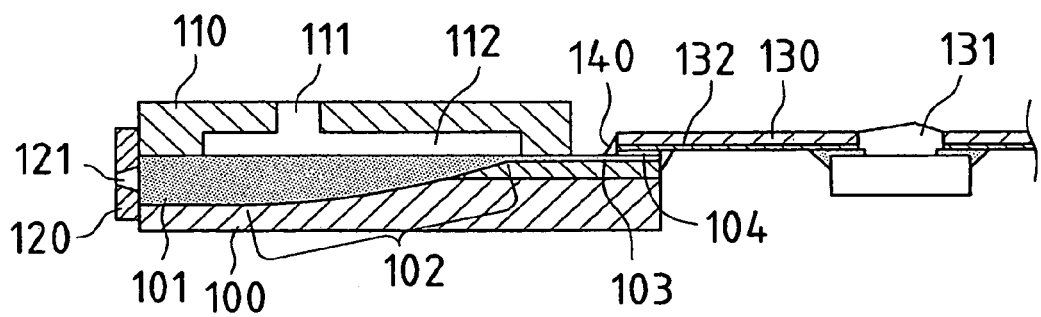
FIG. 9 is a sectional view showing an example of a conventional inkjet head.
Figure 9:
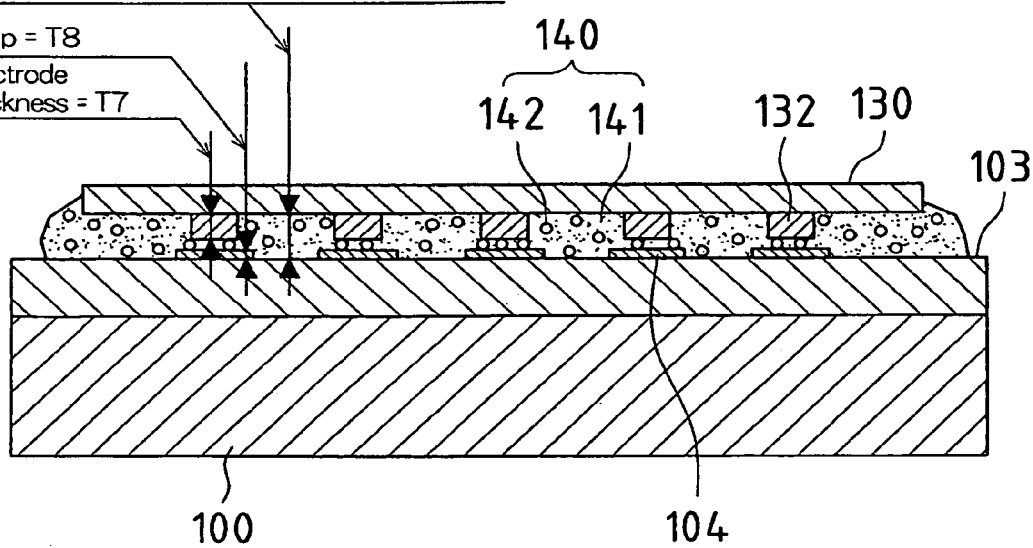
Figure 10:
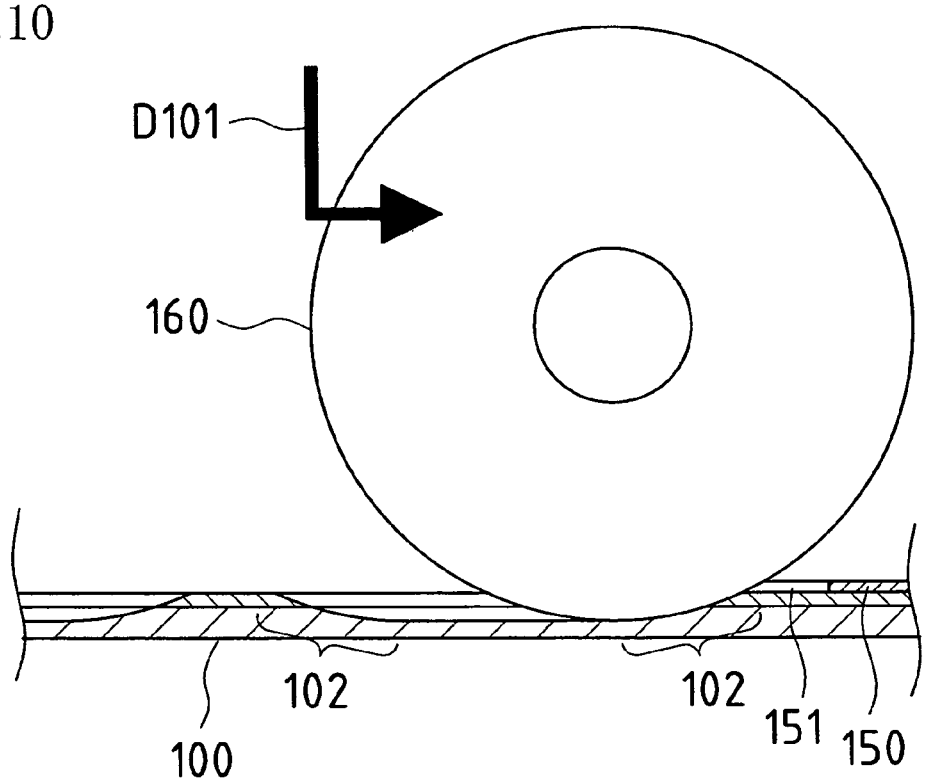
FIG. 10 is a sectional view to assist in describing operations illustrative of an example of a method for causing an electrode within an ink chamber in a conventional inkjet head to extend to a flat region.
Figure 11:
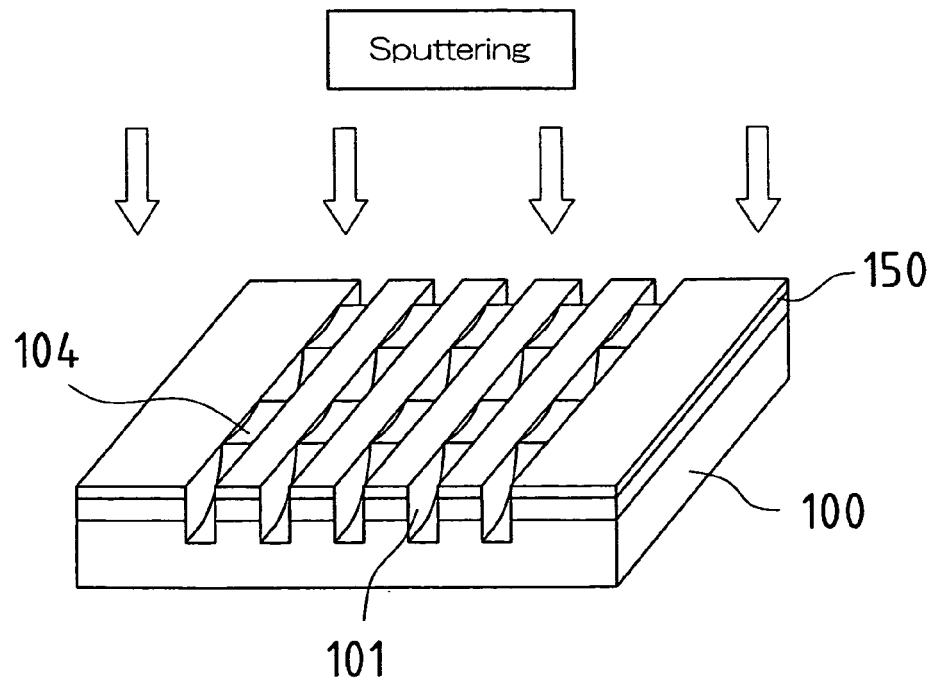
FIG. 11 is an oblique view to assist in describing operations illustrative of an example of a method for causing an electrode within an ink chamber in a conventional inkjet head to extend to a flat region.
Figure 12:
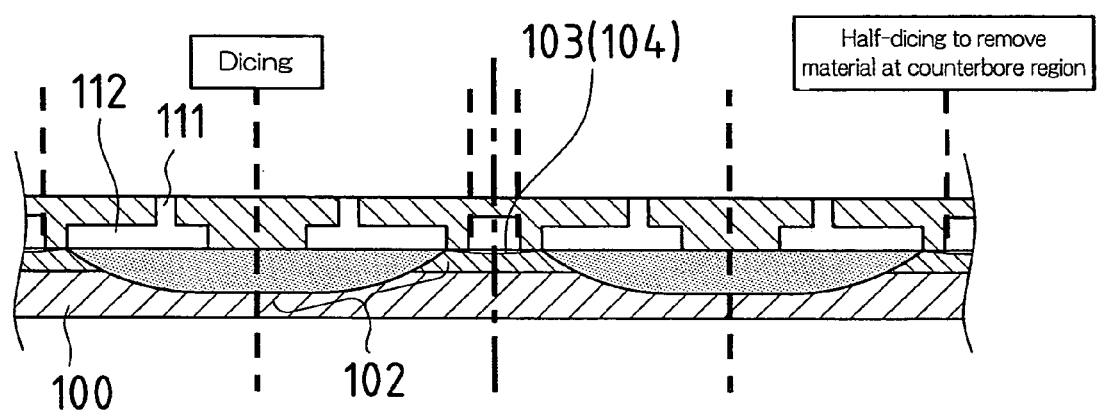
FIG. 12 is a sectional view to assist in describing operations illustrative of an example of a method for causing an electrode within an ink chamber in a conventional inkjet head to extend to a flat region.

FIG. 8 is a sectional view to assist in describing operations illustrative of an example of a method for manufacturing flexible wiring board 80 constituting the circuit board electrode connection structure shown in FIG. 7.

First, sputtering is used to form a thin Cu film over polyimide film (polyimide substrate 81) serving as substrate. Photolithography is then used to create the wiring pattern, forming Cu shield layer 84 (see FIG. 8 (*a*)), and the entire surface is coated with photosensitive polyimide 85 (see FIG. 8 (*b*)). Photosensitive polyimide 85 is then made to remain only in the spaces between wiring runs (i.e., locations at which Cu shield layer 84 is not formed) to form polyimide wall 83 (see FIG. 8 (*c*)). Lastly, plating is used to grow Cu wiring 82 to a thickness of 6μ, plating being carried out only over patterned Cu shield layer 84 (see FIG. 8 (*d*)), as a result of which flexible wiring board 80 can be obtained.

Note that the present invention is not limited to the foregoing second embodiment, it being possible to apply the invention in similar fashion and to obtain similar effect not only with glass epoxy wiring board(s) and/or polyimide substrate flexible wiring board(s), but also with PET substrate wiring board(s), ceramic wiring board(s), glass wiring board(s), and/or other such various wiring board(s) and/or device(s).

Furthermore, circuit board electrode connection structure(s) in accordance with embodiment(s) of the present invention may be utilized for use in environment(s) in which there may be frequent changes in temperature.

Furthermore, the present invention may be embodied in a wide variety of forms other than those presented herein without departing from the spirit or essential characteristics thereof. The foregoing embodiments, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are, moreover, within the scope of the present invention.

What is claimed is:

1. A circuit board electrode connection structure comprising:
    a plurality of circuit boards;
    one or more electrodes formed in or on at least one of the circuit boards; and
    one or more electrode connection regions present at at least one of the circuit boards;
    wherein at least a portion of the circuit boards are directly connected with each other at the one or more electrode connection regions by one or more adhesives intervening therebetween or thereamong;
    wherein at least one thickness of at least one of the adhesives between or among at least two of the plurality of circuit boards in at least one of the electrode connection regions is less than at least one thickness of at least one of the electrodes; and
    wherein:
        at least one of the circuit boards comprises:
            at least one first circuit board comprising at least one first board substrate, and
            at least one second circuit board comprising at least one second board substrate and forming at least one recess;
        at least one of the electrodes protrudes from the at least one first board substrate, and at least one of the electrodes is formed in or on at least one floor of the at least one recess;
        at least one step is formed in at least one depth dimension from at least one surface of the at least one electrode of the at least one second circuit board, to at least one surface of the at least one second board substrate;
        at least one magnitude of the at least one step is smaller than at least one thickness of the at least one electrode protruding from the at least one first board substrate; and
        at least one thickness of at least one of the adhesives is substantially equal to at least one difference between at least one of the thicknesses of at least one of the electrodes protruding from at least one of the first board substrates of at least one of the first circuit boards and at least one of the magnitudes of at least one of the steps in at least one of the recesses in at least one of the second circuit boards.

2. A circuit board electrode connection structure according to claim 1 wherein:
    at least one thickness of at least one of the adhesives is substantially not more than 10 μ.

3. A circuit board electrode connection structure according to claim 1 wherein:
    at least a portion of the circuit boards constitutes at least one species selected from among the group consisting of one or more inkjet heads, one or more semiconductor devices, one or more liquid crystal display panels, and one or more microelectromechanical systems.

4. A circuit board electrode connection structure according to claim 1 wherein:
    at least one of the adhesives is formed using one or more anisotropic electrically conductive adhesives.

5. The circuit board electrode connection structure according to claim 1, wherein at least one of the second circuit boards has a smaller coefficient of thermal expansion than at least one of the adhesives.

* * * * *